(12) United States Patent
Shinohara et al.

(10) Patent No.: US 9,425,695 B2
(45) Date of Patent: Aug. 23, 2016

(54) DC-DC CONVERTER

(71) Applicant: Hitachi Automotive Systems, Ltd., Hitachinaka-shi, Ibaraki (JP)

(72) Inventors: Hidenori Shinohara, Hitachinaka (JP); Tatsuya Nakazawa, Yokohama (JP); Keisuke Fukumasu, Tokyo (JP); Yoshiharu Yamashita, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/419,067

(22) PCT Filed: Jun. 28, 2013

(86) PCT No.: PCT/JP2013/067763
§ 371 (c)(1),
(2) Date: Feb. 2, 2015

(87) PCT Pub. No.: WO2014/021035
PCT Pub. Date: Feb. 6, 2014

(65) Prior Publication Data
US 2015/0194898 A1    Jul. 9, 2015

(30) Foreign Application Priority Data

Aug. 3, 2012  (JP) ................................. 2012-172468

(51) Int. Cl.
*H02M 3/335* (2006.01)
*H05K 9/00* (2006.01)
*H05K 7/20* (2006.01)
*H02M 1/44* (2007.01)

(52) U.S. Cl.
CPC ....... *H02M 3/33507* (2013.01); *H05K 7/20927* (2013.01); *H05K 9/0037* (2013.01); *H02M 1/44* (2013.01); *H02M 3/33576* (2013.01)

(58) Field of Classification Search
CPC ... H05K 9/0037; H05K 7/20927; H02M 1/44; H02M 3/33507; H01R 13/68
USPC ........................................... 363/17; 361/623
See application file for complete search history.

(56) References Cited

U.S. PATENT DOCUMENTS 8,169,780 B2 *  5/2012  Yoshino ............. H05K 7/20927
                                                    165/104.33
(Continued)

FOREIGN PATENT DOCUMENTS

JP    2000-324839 A    11/2000
JP    2008-125283 A     5/2008
(Continued)

OTHER PUBLICATIONS

International Search Report (PCT/ISA/210) dated Oct. 8, 2013 with English translation (five pages).
(Continued)

*Primary Examiner* — Adolf Berhane
*Assistant Examiner* — Afework Demisse
(74) *Attorney, Agent, or Firm* — Crowell & Moring LLP

(57) ABSTRACT

There is provided a device in which superimposition of noise radiated from a circuit is reduced, and a noise reducing effect of a filter is ensured. A DC-DC converter according to the present invention includes a transformer, a high voltage-side switching circuit section, a low voltage-side switching circuit section, a noise filter circuit section electrically disposed between the low voltage-side switching circuit section and the low voltage-side circuit section, a metallic case that houses the transformer, the high voltage-side switching circuit section, the low voltage-side switching circuit section, and the noise filter circuit section, a drive circuit board having a drive circuit that drives the low voltage-side switching circuit section, and a metallic base board having the drive circuit board mounted thereon. The case has a metallic partition wall connected to the case. The partition wall is disposed between the low voltage-side switching circuit section and the noise filter circuit section. The partition wall is connected to the base board.

5 Claims, 13 Drawing Sheets

(56) References Cited

U.S. PATENT DOCUMENTS

| | | | |
|---|---|---|---|
| 2009/0073335 A1* | 3/2009 | Yagi | G02F 1/133707 349/39 |
| 2010/0321889 A1 | 12/2010 | Yoshino et al. | |
| 2013/0094269 A1* | 4/2013 | Maeda | H02M 7/003 363/141 |

FOREIGN PATENT DOCUMENTS

| | | |
|---|---|---|
| JP | 2009-284701 A | 12/2009 |
| JP | 2010-245232 A | 10/2010 |
| JP | 2011-4520 A | 1/2011 |
| JP | 2011-139602 A | 7/2011 |
| WO | WO 2011/125781 A1 | 10/2011 |

OTHER PUBLICATIONS

Japanese Office Action issued in counterpart Japanese Application No. 2012-172468 dated May 12, 2015, with English translation (five (5) pages).

* cited by examiner

DC-DC CONVERTER

TECHNICAL FIELD

The present invention relates to a DC-DC converter device, and more specifically, to a DC-DC converter device especially applied to the electric automobile and the plug-in hybrid vehicle.

BACKGROUND ART

A high voltage storage battery and a low voltage storage battery are mounted on the electric automobile or the plug-in hybrid vehicle. The high voltage storage battery is used as a power drive for driving the motor via an inverter device, and the low voltage storage battery is used for activating the accessory such as a light and a radio of the vehicle.

The vehicle of the above type has a DC-DC converter device for power conversion from the high voltage storage battery to the low voltage storage battery, or from the low voltage storage battery to the high voltage storage battery.

In the filter circuit connected to the power conversion device, the noise radiated from the power conversion circuit, which propagates through the space, and the electromagnetic noise generated by the eddy current flowing in the housing maybe superimposed on the filter circuit to cause the risk of deteriorating filter performance.

Patent Literature 1 discloses the known means for solving the aforementioned problem, only proposing the case having a metallic base section to which the ground potential is applied. The aforementioned related art still has the problem that the noise owing to the noise current superimposed on the base section is not taken into consideration.

It is demanded that the aforementioned DC-DC converter device should lessen the influence resulting from radiation of the electromagnetic noise generated in the device.

CITATION LIST

Patent Literature

Patent Literature 1: Japanese Unexamined Patent Application Publication No. 2000-324839

SUMMARY OF INVENTION

Technical Problem

It is an object of the present invention to provide a device for reducing superimposition of the noise radiated from the circuit to ensure the filter noise reduction effect.

Solution to Problem

The DC-DC converter according to the present invention includes a transformer, a high voltage-side switching circuit section electrically disposed between the transformer and a high voltage-side circuit section, a low voltage-side switching circuit section electrically disposed between the transformer and a low voltage-side circuit section, a noise filter circuit section electrically disposed between the low voltage-side switching circuit section and the low voltage-side circuit section, a metallic case that houses the transformer, the high voltage-side switching circuit section, the low voltage-side switching circuit section, and the noise filter circuit section, a drive circuit board having a drive circuit that drives the low voltage-side switching circuit section, and a metallic base board having the drive circuit board mounted thereon. The case is disposed between the low-voltage switching circuit section and the noise filter circuit section, and has a metallic partition wall connected to the case. The base board is disposed at a position opposite a bottom surface of the case, which interpose the low-voltage switching circuit section. The partition wall is connected to the base board.

Advantageous Effects of Invention

The present invention ensures to lessen the influence of the noise current on the filter circuit section.

BRIEF DESCRIPTION OF DRAWINGS

FIG. 3(*b*) is an exploded perspective view of a high voltage circuit 106.

FIG. 4(*b*) is a plan view representing an inner section of the DC-DC converter device 100.

FIG. 4(*c*) is a sectional view taken along line A-A of FIG. 4(*b*), which is seen from an arrow direction.

FIG. 6(*b*) is a perspective view representing the filter substrate 120 in the DC-DC converter device 100, when seen from the direction different from the one shown in FIG. 6(*a*).

FIG. 8(*b*) is a sectional view taken along line B-B of FIG. 8(*a*) when seen from the arrow direction.

FIG. 9(*b*) is a sectional view taken along line A-A of FIG. 9(*a*) when seen from the arrow direction.

DESCRIPTION OF EMBODIMENT

Figure 1:
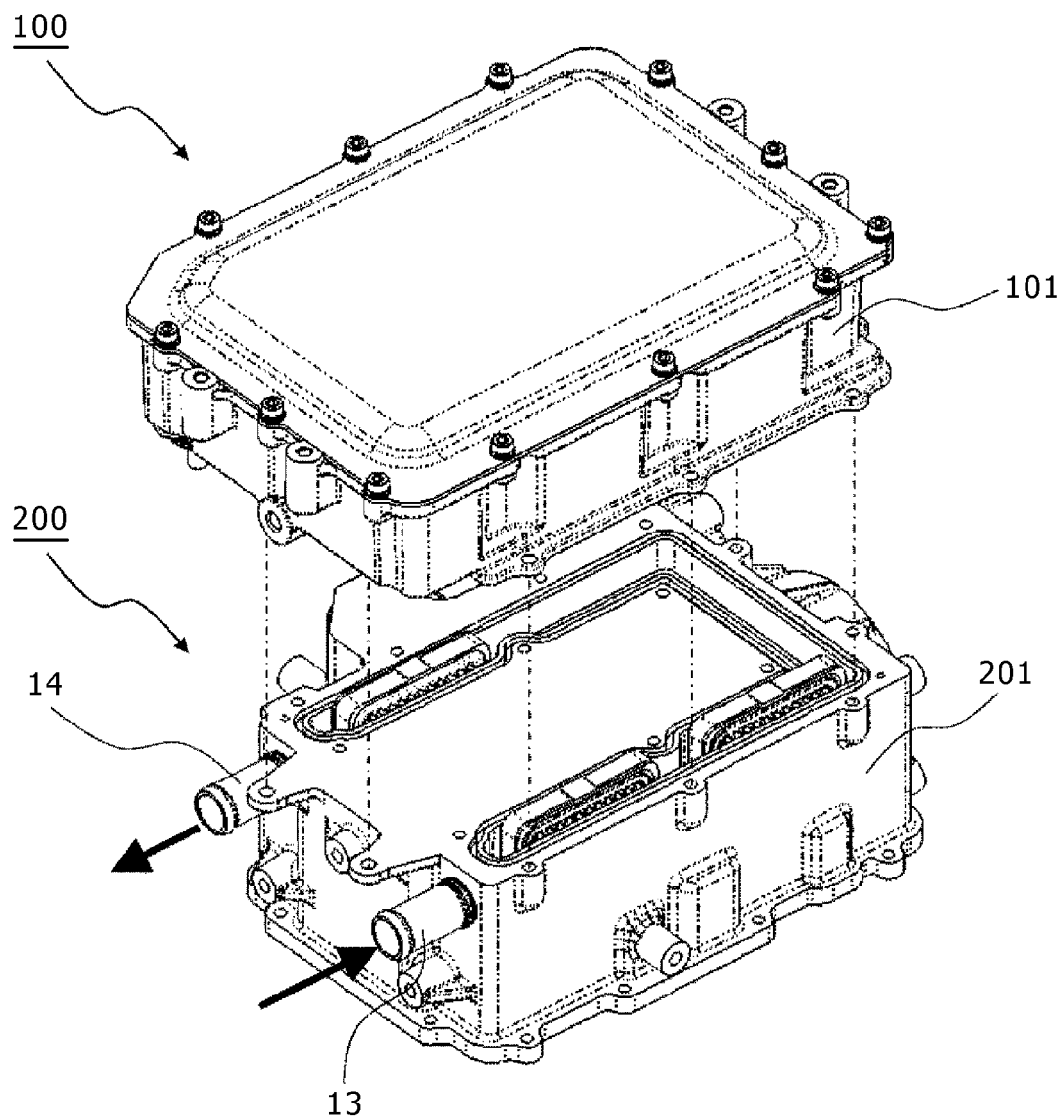
FIG. 1 is a diagrammatic perspective view for explaining a power converter.

An embodiment for carrying out the present invention will be described referring to the drawings.

FIG. 1 is a perspective view showing an outline of a power converter. The power converter is formed by integrating the DC-DC converter device 100 and an inverter device 200. FIG. 1 shows the DC-DC converter device 100 and the inverter device 200 which are separated. The DC-DC converter device 100 is fixed to a bottom surface of a case of the inverter device 200 with a plurality of bolts (not shown).

The power converter is applied to the electric automobile. The inverter device 200 serves to drive the traction motor by the power from the onboard high voltage storage battery. The low voltage storage battery is mounted on the vehicle for activating the accessory such as the light and radio. The DC-DC converter device 100 carries out power conversion from the high voltage storage battery to the low voltage storage battery, or from the low voltage storage battery to the high voltage storage battery.

A refrigerant flow passage through which the refrigerant flows is formed in the side wall of a case 201 of the inverter device 200. The refrigerant flows into the flow passage from an inlet pipe 13, and flows out from an outlet pipe 14. Meanwhile, a case 101 of the DC-DC converter device 100 is fixed to the opposite bottom surface of the inverter device 200 without leaving any gap therebetween. In the fixed state, the DC-DC converter device 100 is allowed to share the refrigerant flow passage. In this embodiment, generally, water is suitable as the refrigerant. However, the refrigerant of any other type may be employed.

Figure 2:
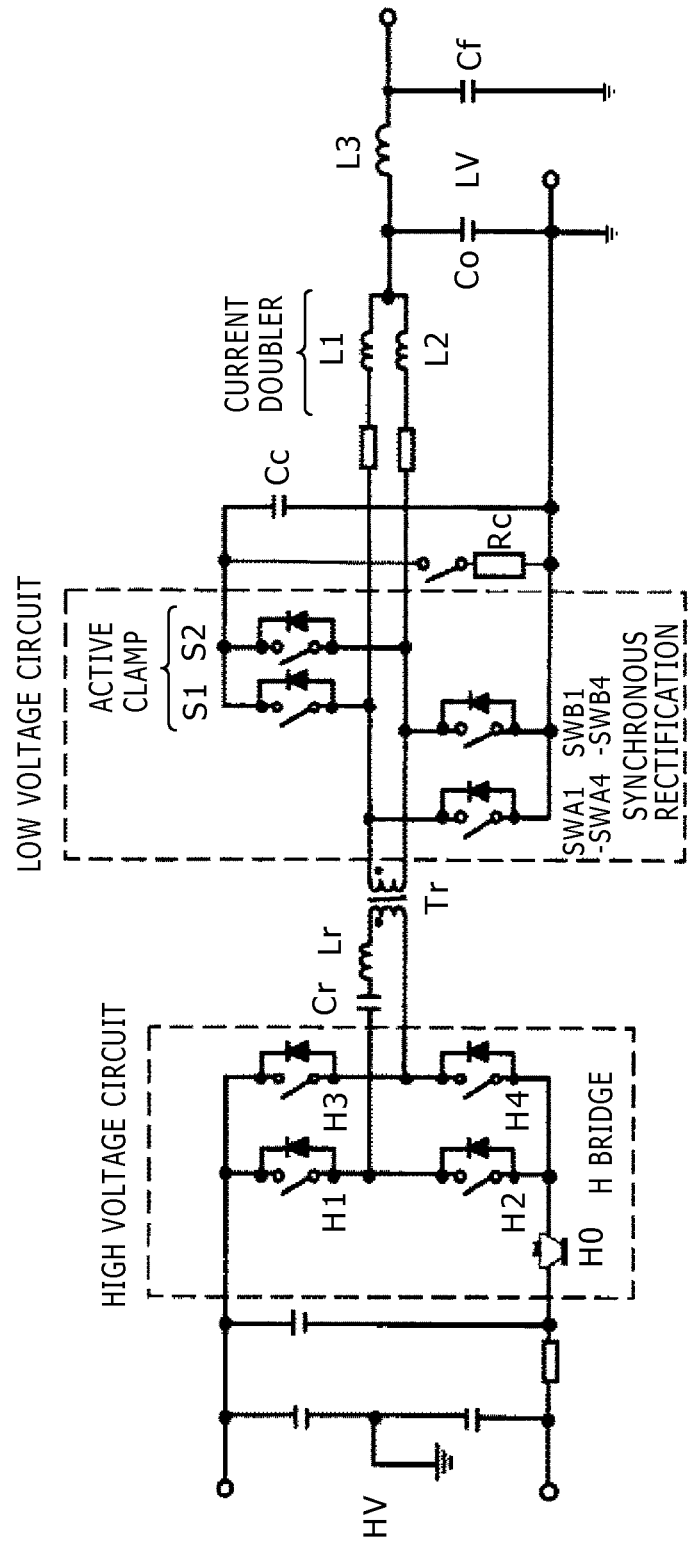
FIG. 2 is a view representing a circuit structure of a DC-DC converter device 100.

The DC-DC converter device 100 will be described. FIG. 2 is a view showing a circuit structure of the DC-DC converter device 100. As FIG. 2 shows, the DC-DC converter device 100 according to this embodiment is configured to carry out bilateral DC-DC conversion for converting the voltage between the low voltage storage battery and the high voltage storage battery. The high voltage circuit is configured as an H bridge circuit, and the low voltage circuit is configured to have a synchronous rectification circuit and an active clamp circuit. Efforts have been made to employ the large current component for the switching element and enlarge the smoothing choke coil so as to realize the high output through the bilateral DC-DC conversion.

More specifically, the H bridge type switching circuit structure (H1 to H4) is provided at the high voltage side, which uses MOSFET with reflux diode. The switching control is conducted through zero voltage switching at the high switching frequency (100 kHz) using the LC circuit (Cr, Lr) to reduce the switching loss and improve the conversion efficiency. An IGBT switch (H0) is provided as the selector switch which is turned ON in the step-down mode, and is turned OFF in the step-up mode.

The synchronous rectification circuit using MOSFET of double voltage (current doubler) full wave rectification type is provided for ensuring high output at the low voltage side. The high output is ensured by allowing a plurality of switching elements to be subjected to parallel simultaneous operation. Referring to the example shown in FIG. 2, four elements, for example, SWA 1 to SWA 4, SWB 1 to SWB 4 are arranged in parallel. Small reactors (L1, L2) of the switching circuit and the smoothing reactor are arranged so that two circuits are symmetrically arranged in parallel for high output. In this way, the compact reactors are provided as two-circuit arrangement so as to make the entire structure of the DC-DC converter device compact compared with the case where the single large-sized reactor is disposed. In addition, the active clamp circuit is disposed to suppress generation of surge voltage in switching for reducing the pressure resistance of the switching element. The resultant low pressure resistance of the circuit section allows the device to have the compact size. The LC filter circuit is provided for reducing the output noise of the DC-DC converter device 100. The LC filter circuit includes a reactor L3 and a capacitor Cf as the series circuit.

Figure 3A:
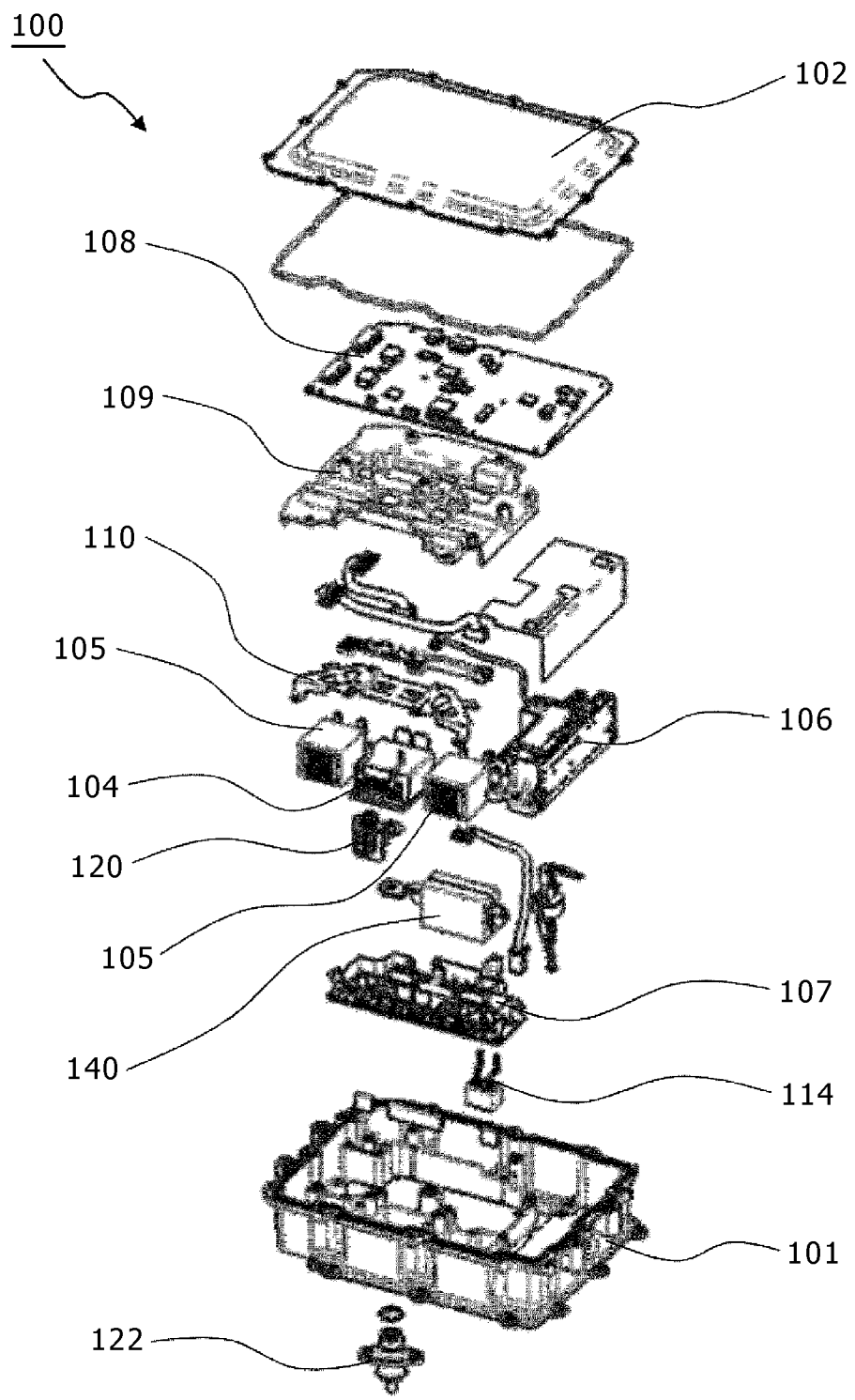
FIG. 3(*a*) is an exploded perspective view for explaining the component arrangement in the DC-DC converter device 100.
Figure 3B:
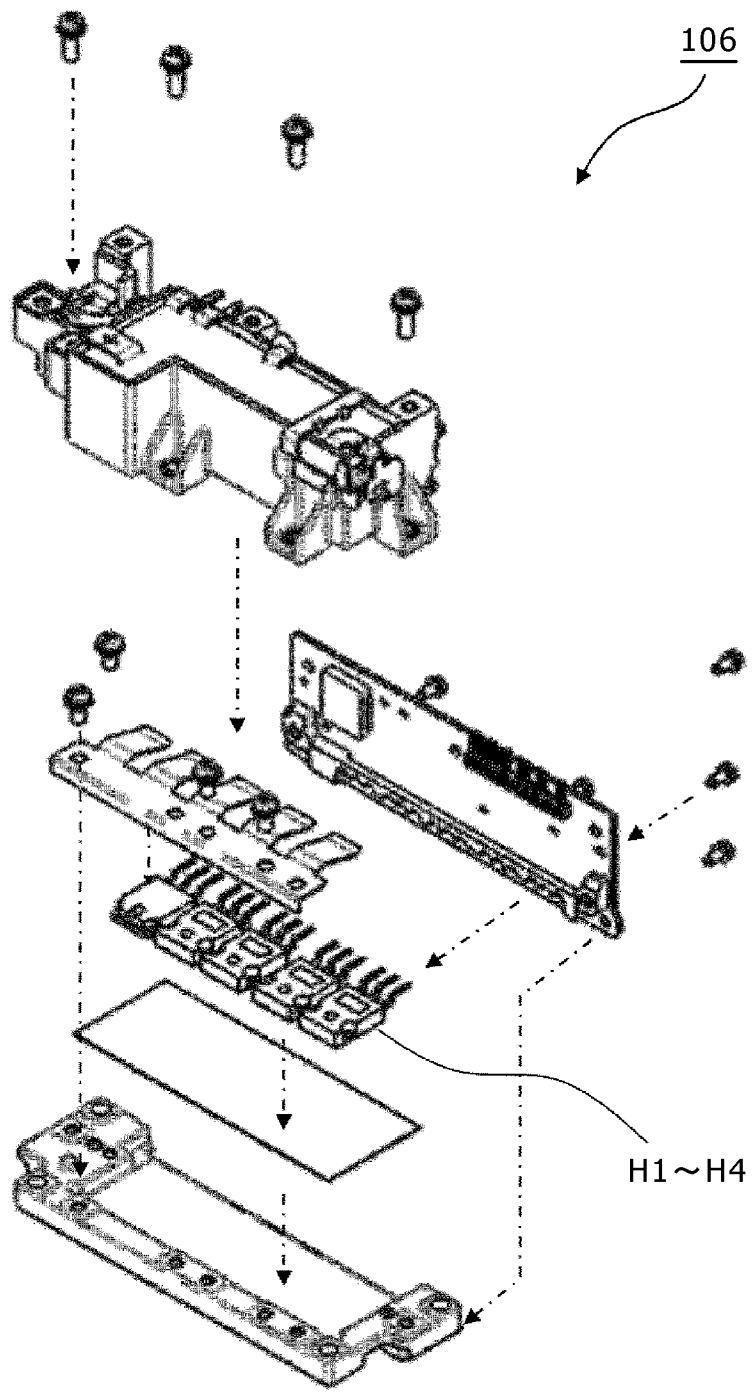
Figure 4A:
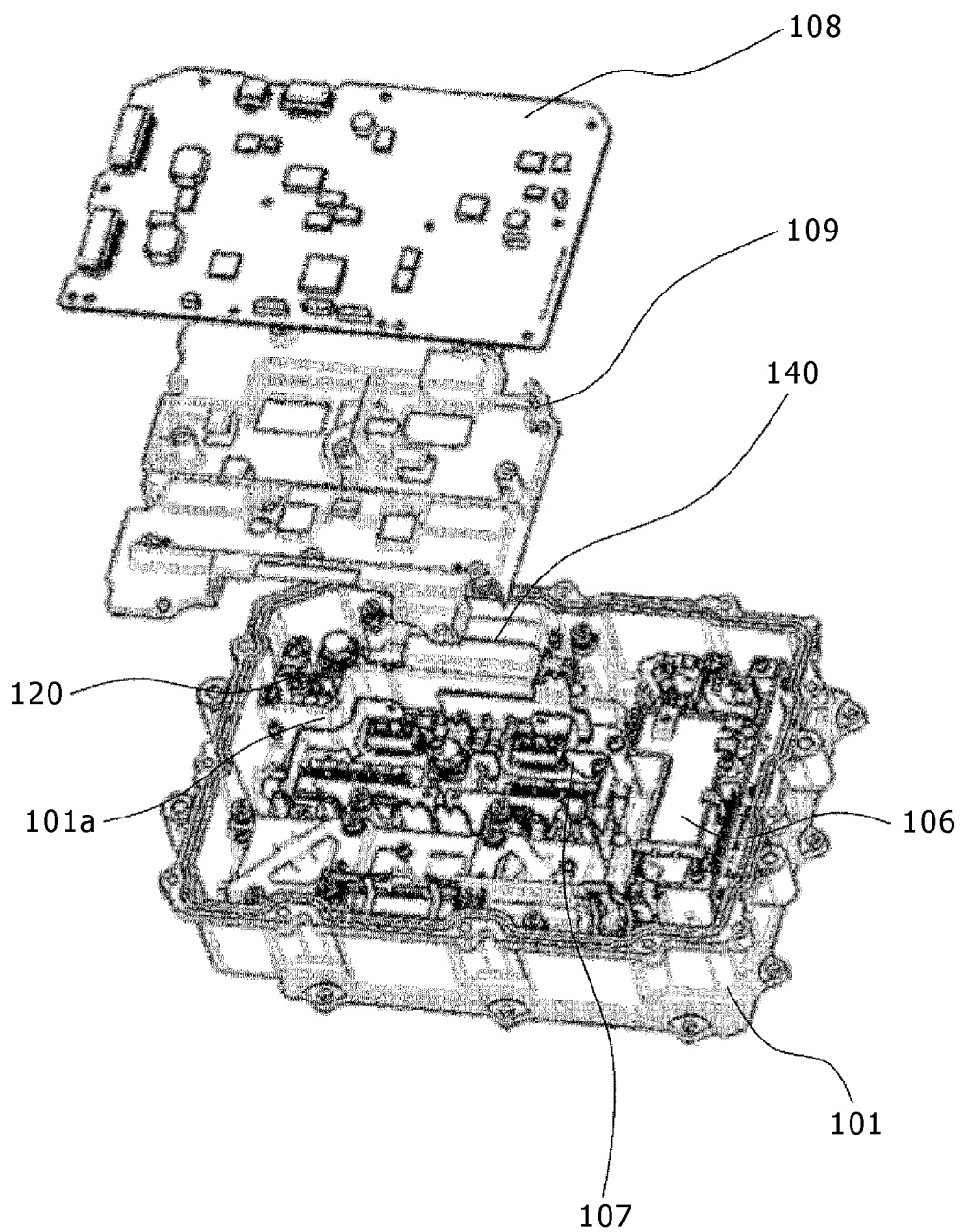
FIG. 4(*a*) is an exploded perspective view for explaining an inner structure of the DC-DC converter device 100.

FIG. 3(*a*) is an exploded perspective view of the DC-DC converter device 100. FIG. 3(*b*) is an exploded perspective view of a high voltage circuit 106. FIG. 4(*a*) is an exploded perspective view of an inner structure of the DC-DC converter device 100. FIG. 4(*b*) is a plan view showing the inside of the DC-DC converter device 100. FIG. 4(*c*) is a sectional view taken along line A-A of FIG. 4(*b*) as a view seen from the arrow direction. FIG. 5 is a perspective view illustrating a low voltage substrate in the DC-DC converter device 100.

A control circuit board 108 has a control circuit mounted thereon for controlling the switching elements provided in the low voltage circuit and the high voltage circuit. The control circuit board 108 is fixed to a protruding portion formed on the upper surface of a metallic base board 109 with a bolt and the like. The base board 109 is fixed to a plurality of support portions protruding upward from the bottom surface of the case 101 with the bolt. As a result, the control circuit board 108 is provided above heat generating sections (the main transformer 104, an inductor element 105 and the like) disposed on the bottom surface of the case via the base board 109.

As FIG. 3(*a*) shows, the circuit components of the DC-DC converter device 100 are housed in the metallic case 101 (for example, aluminum die-casting). An opening of the case 101 is fitted with a case cover 102 with bolts. As described above, the case 201 of the inverter device 200 is fixed to the bottom surface side of the case 101. The high voltage circuit 106 on which the main transformer 104, the inductor element 105, the switching elements H1 to H4 are mounted, and a low voltage circuit 107 on which the switching elements SWA 1 to SWA 4, SAWB 1 to SWB 4 are mounted are disposed on the bottom surface inside the case. FIG. 3(*b*) is an exploded perspective view of the high voltage circuit 106.

In reference to the circuit diagram of FIG. 2, the main transformer 104 correspond to a transformer Tr, and the inductor elements 105 correspond to the current doubler reactors L1, L2. The low voltage circuit board 107 includes switching elements S1, S2 of the active clamp circuit shown in FIG. 2 mounted thereon.

As FIG. 5 shows, the low voltage circuit 107 has the switching elements 170 to 177 mounted on the metallic substrate on which patterns are formed. Metallic bus bars 160, 161, 162, 163, 164, 190, 191 are mounted on the metallic substrate.

A ferrite core 140 and a filter substrate 120 constitute an LC filter circuit disposed for reducing the output noise of the DC-DC converter device 100. They constitute a π type LC filter circuit together with a smoothing capacitor 130 mounted on the substrate of the low voltage circuit 107. The circuit structure is not limited to the π type LC filter circuit so long as it is intended to reduce the output noise. An output terminal 122 shown in FIG. 4(*c*) functions as the output terminal in power conversion from the HV side to the LV side, and functions as the input terminal in power conversion from the LV side to the HV side. The converter according to this embodiment is allowed to conduct the bilateral power conversion between the HV side and the LV side. However, the converter may be configured to conduct the one-way power conversion.

A shield wall 101*a* integrated with the case 101 is formed between the LC filter circuit and the low voltage circuit section 107. The output bus bar 162 shown in FIG. 5 bypasses the shield wall 102 to electrically couple the low voltage circuit 107, the ferrite core 140, the filter substrate 120 and the output terminal 122.

The shield wall 101*a* ensures to prevent interference in the noise lessening effect of the filter owing to superimposition of the switching radiation noise on the LC filter circuit, which is caused by the switching elements of the high voltage circuit 106 and the low voltage circuit 107 although the LC filter circuit, the high voltage circuit 106 and the low voltage circuit 107 are housed in the same housing. There is no need of providing an additional housing for the LC filter circuit.

Figure 6A:
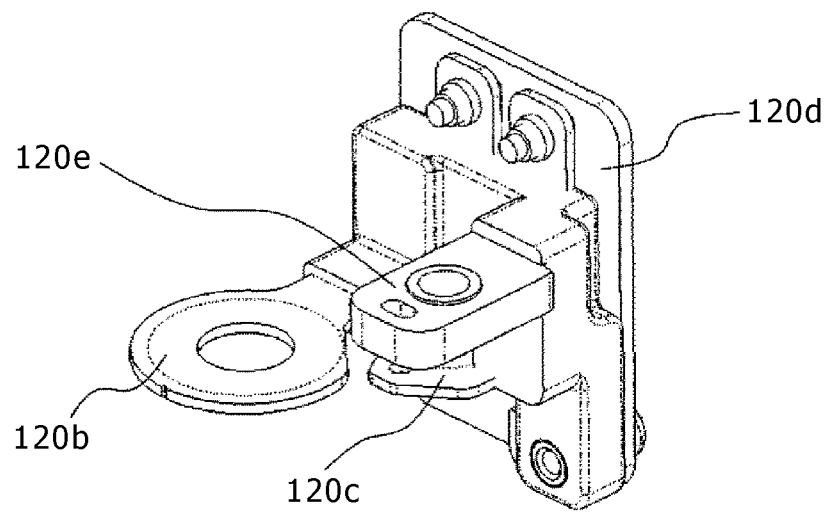
FIG. 6(*a*) is a perspective view representing a filter substrate 120 in the DC-DC converter device 100.
Figure 6B:
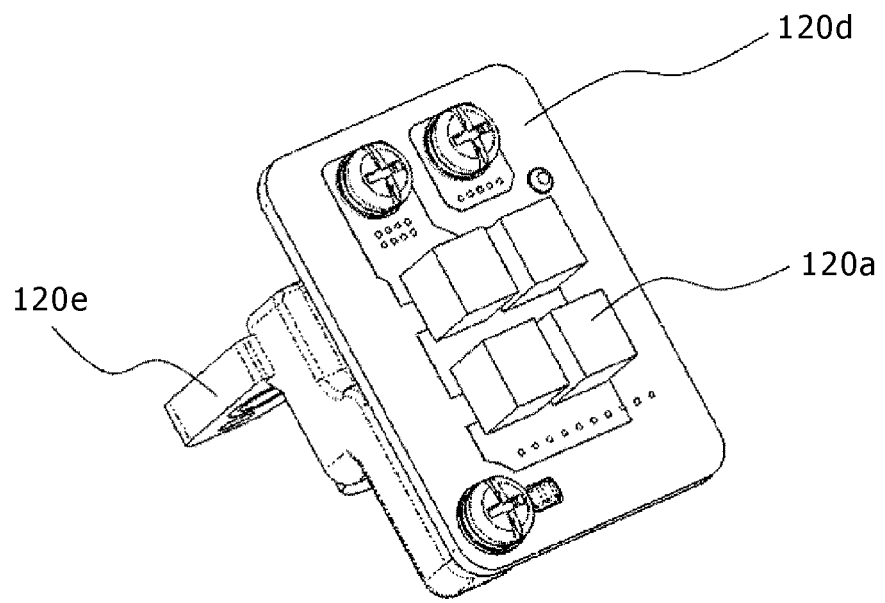

FIGS. 6(a) and 6(b) are perspective views each illustrating an outline of the filter substrate 120.

A ceramic capacitor 120a is mounted on a substrate 120d, which exhibits a noise filtering function. A holding member 120e is a member produced by integral molding of a filter output bus bar 120b for electric coupling between the capacitor 120a and the output terminal 122, and a GND bus bar 120c for electric coupling between the capacitor 120a and the case 101. An insulator is interposed between the filter output bus bar 120b and the GND bus bar 120c so as to retain the insulation state. A holding member 120e is held and screwed to the filter substrate 120d.

Figure 7:
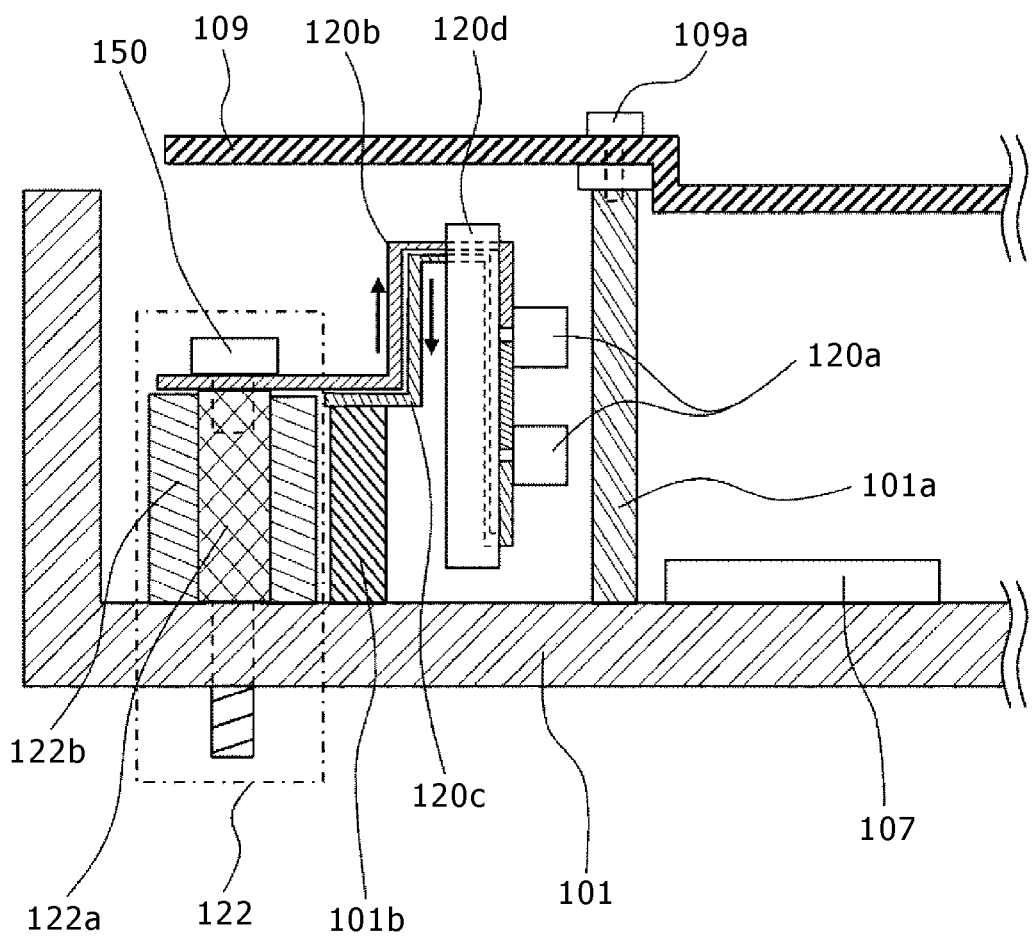
FIG. 7 is a schematic sectional view for explaining the structure around the filter substrate 120 in the DC-DC converter device 100.

FIG. 7 is a sectional view representing connection between the filter substrate 120 and the output terminal 122. Arrows in the drawing represent directions of the noise current flowing through the filter circuit.

Referring to FIG. 7, the filter output bus bar 120b and the GND bus bar 120c are adjacently disposed to face with each other. This may reduce a loop area formed by the filter output bus bar 120b, the filter substrate 120d, and the GND bus bar 120c. As a result, superimposition of the switching noise from the high voltage circuit 106 and the low voltage circuit 107 may be reduced.

The output terminal 122 includes a metallic section 122a and a mold section 122b. The mold section is fixed to the case 101 with a screw (not shown). Meanwhile, the film output bus bar 120b is fixed to the metallic section 122a of the output terminal 122 with a screw 150.

The GND bus bar 120c is fixed to the case 101b with a screw (not shown).

The case 101 and the base board 109 are fixed with a screw at a connection section 109a via the shield wall 101a, which are electrically coupled with each other.

This allows the base board 109 to function as a shield for shielding the switching radiation noise from the switching element, and to bypass the noise current superimposed on the base board 109 to the case 101 before such current flows to the filter circuit section 120.

The bus bar to which the switching noise is transmitted and the filter circuit section 120 are electrically shielded from the noise superimposed on the base board 109 caused by switching between the high voltage circuit 106 and the low voltage circuit 107. This makes it possible to prevent the noise current from flowing to the filter circuit section 120 so as to provide sufficient filter effect. It is therefore possible to reduce the noise without lessening the filter effect.

The direct connection to the base board no longer requires connection with another component, thus providing the effect of reducing the number of components and improving productivity. Furthermore, it is possible to dispose the high voltage circuit 106, the low voltage circuit 107, and the filter circuit 120 in the same housing, ensuring to make the structure compact and reduce the number of components.

Figure 8A:
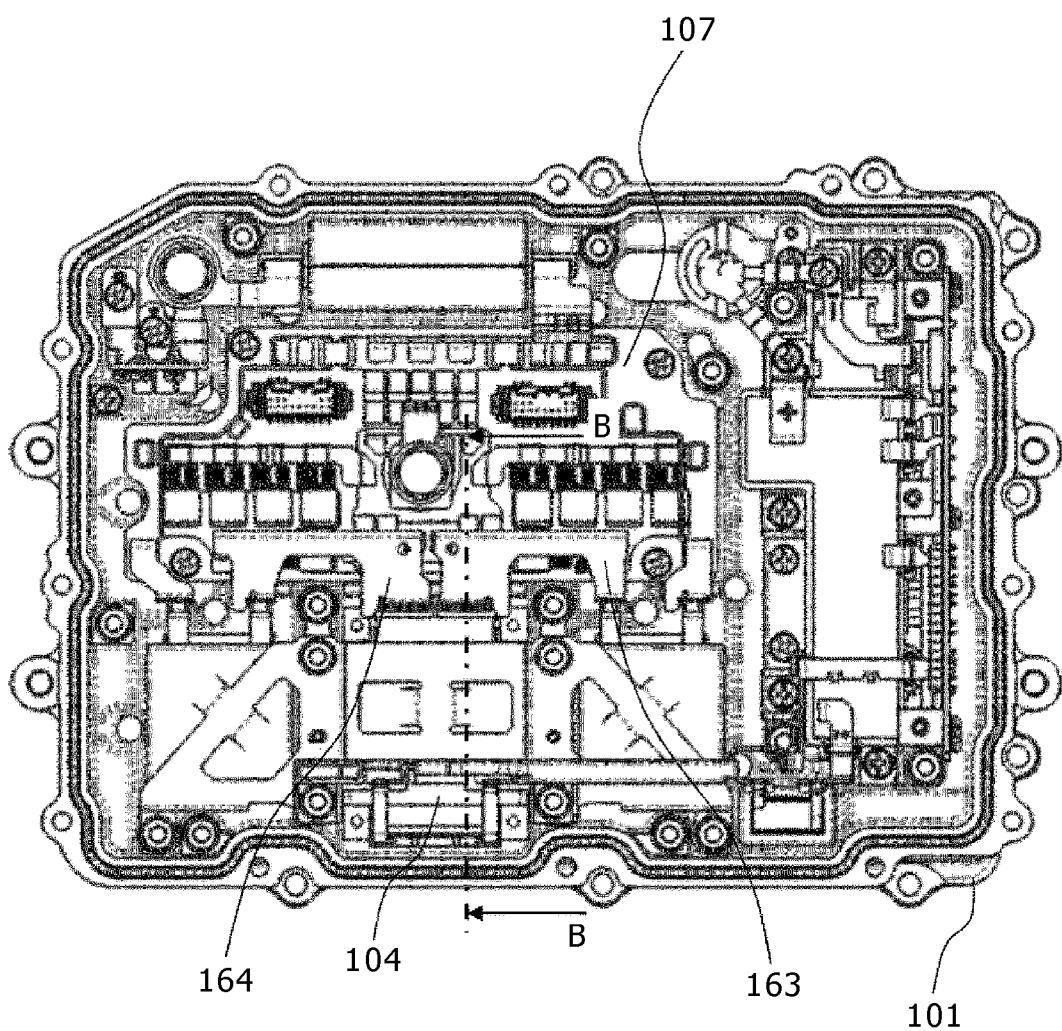
FIG. 8(*a*) is a plan view showing the inside of the DC-DC converter device 100 (as an explanatory view of a connection state between bus bars 163, 164 and a main transformer 104).
Figure 8B:
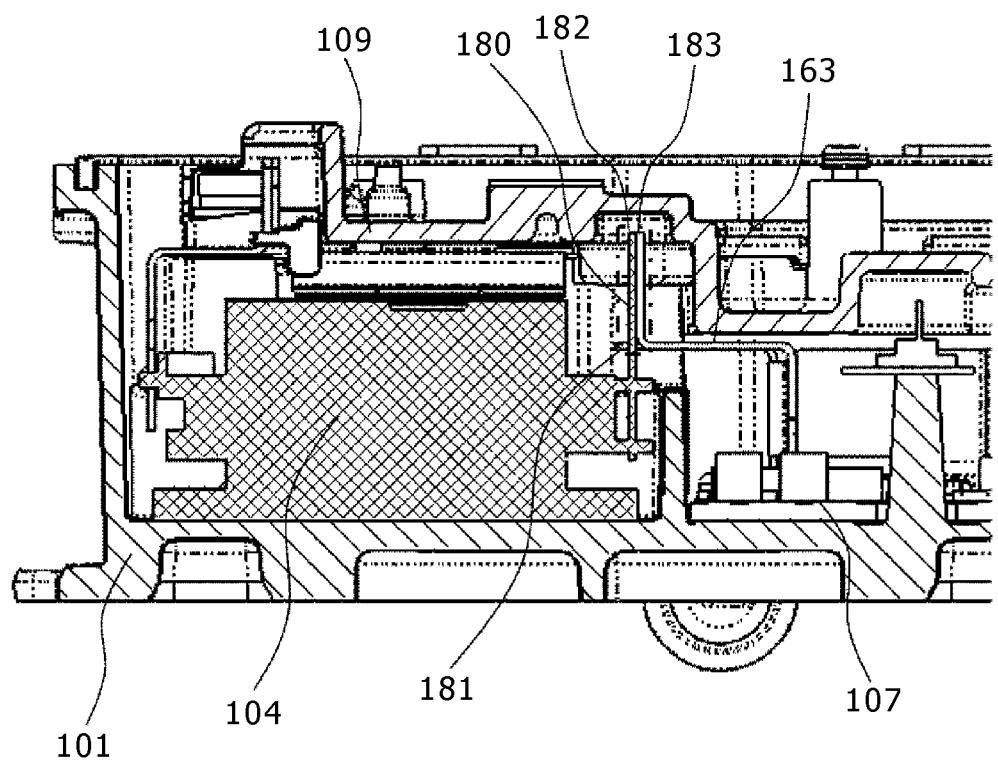

FIG. 8(a) is a plan view showing an inner configuration of the DC-DC converter device 100. FIG. 8(b) is a sectional view taken along line B-B of FIG. 8(a) as a view seen from the arrow direction.

The low voltage circuit 107 has the metallic bus bars 160, 161, 163, 164 mounted on the metallic substrate. The transformer 104 includes a bus bar 180 connected to the bus bar 163 or the bus bar 164. The transformer 104 is disposed on the bottom surface of the case 101 at the side of the low voltage circuit 107.

The bus bars 163 and 164 are provided erect from the low voltage circuit 107 to bend toward the direction where the transformer 104 is arranged. The low voltage circuit 107 and the transformer 104 are electrically coupled by bonding the bus bar 163 or 164 to the bus bar 180. A connection section 181 between the bus bar 163 or 164 and the bus bar 180 is formed so that an end side surface 183 of the bus bar 163 or 164 and an end side surface 182 of the bus bar 180 are laminated to face the base board 109.

The aforementioned connection makes it possible to reduce the area of the portion where the bus bars 163, 164, 180 face the base board 109. As a result, the parasitic capacitance that exists between the bus bars 163, 164 connected to the transformer 104, and the base board 109 may be decreased. Then it is possible to lessen superimposition of the switching noise caused by switching between the high voltage circuit 106 and the low voltage circuit 107 on the base board 109.

The connection between the bus bars 163, 164 and the main transformer 104 has been described with respect to the shape characteristic and the resultant effect. The connection between the bus bars 160, 161 and the inductor element 105 is similar to the connection as described above, which is expected to provide the similar effects.

Figure 9A:
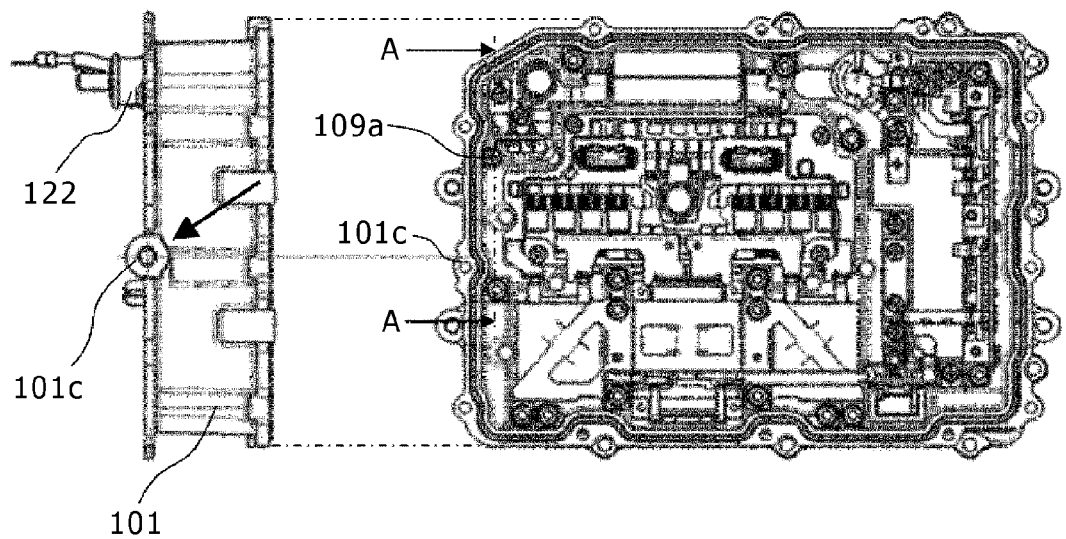
FIG. 9(*a*) is a plan view showing the inside of the DC-DC converter device 100 (as an explanatory view of an arrangement of a connection section 109*a*, the filter circuit 120, and the ground with respect to a ground terminal 101*c*).
Figure 9B:
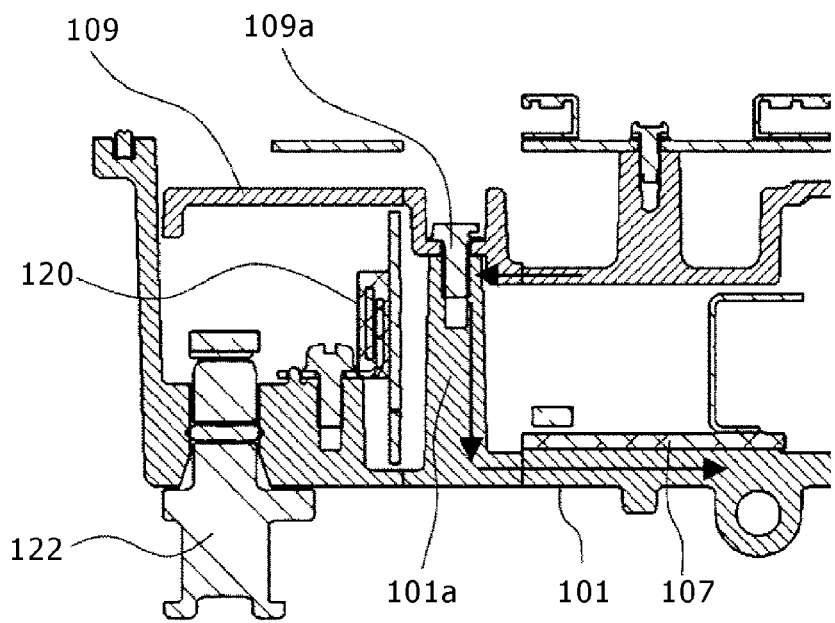

FIG. 9(a) is a plan view showing an inner configuration of the DC-DC converter device 100. FIG. 9(b) is a sectional view taken along line A-A of FIG. 9(a) as a view seen from the arrow direction.

The connection section 109a is positioned in the space between the filter circuit 120 and the ground terminal 101c to the ground near the outer wall of the case 101. The aforementioned arrangement allows the noise current superimposing on the base board 109 to bypass to the ground terminal 101c for grounding through the shield wall 101a and the connection section 109a thereof shown as the path indicated by the arrow of FIG. 9(b).

It is therefore possible to prevent transmission of the noise current superimposed on the base board 109 to the filter circuit 120, thus ensuring lessening of external output of the noise owing to switching between the high voltage circuit 106 and the low voltage-side switching circuit section 107 from the external output terminal.

Figure 4B:
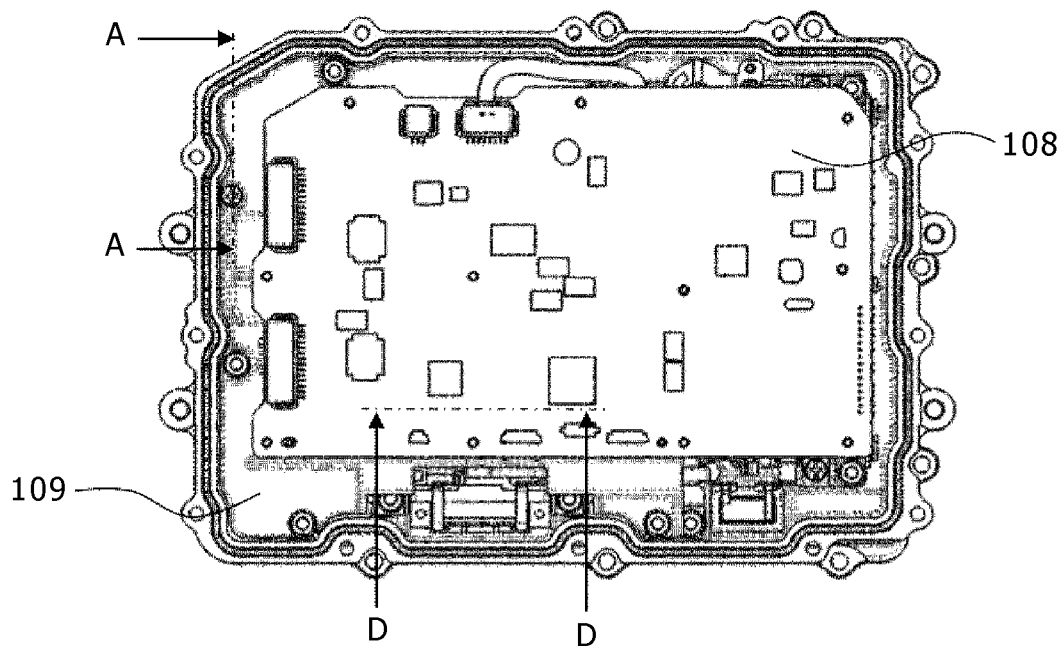
Figure 4C:
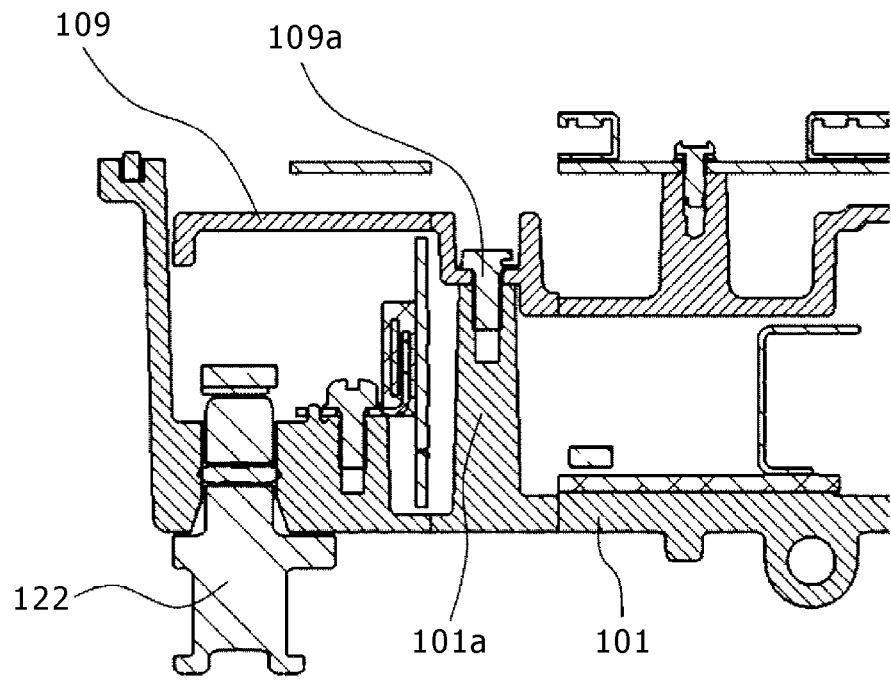
Figure 5:
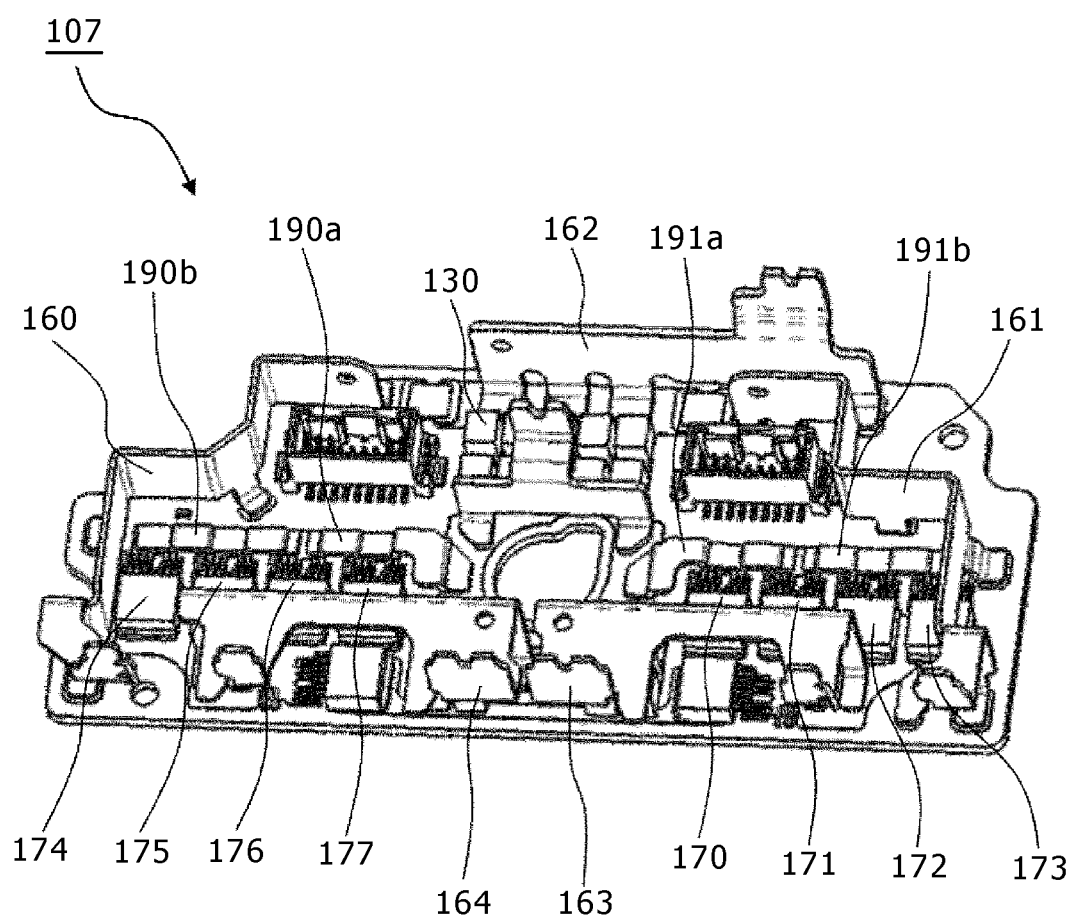
FIG. 5 is a perspective view representing a low voltage substrate 107 in the DC-DC converter device 100.
Figure 10:
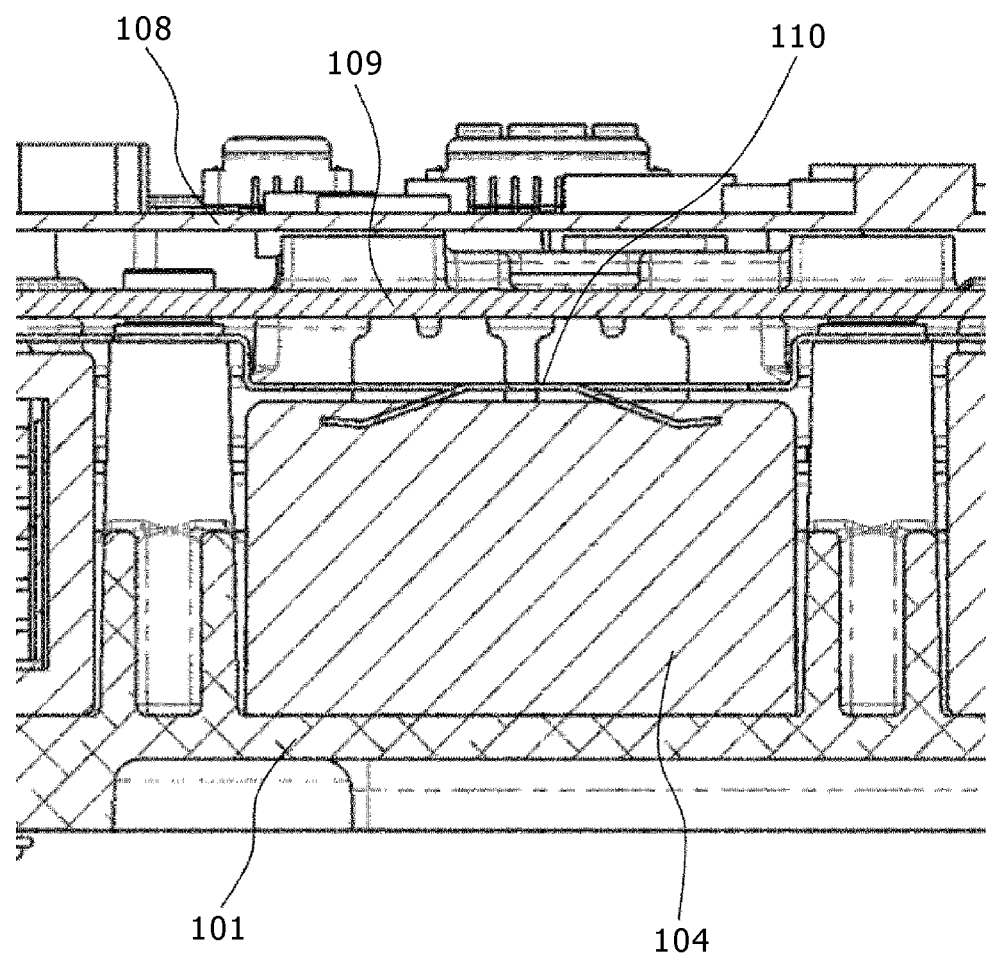
FIG. 10 is a sectional view taken along line D-D of FIG. 4(*b*) when seen from the arrow direction.

FIG. 10 is a sectional view taken along line D-D of FIG. 4(b). The transformer 104 is pressed toward the bottom surface of the case 101 with the metallic board 110 so as to be fixed thereto with the screw. This makes it possible to shield the influence of the magnetic field generated by the transformer 104 with the metallic board 110 without transmission to the base board 109. As for connection of the metallic board 110, the main transformer 104 and the case 101 are fixed via the metallic board 110 so as to suppress backlash upon mount of the main transformer 104, and to exhibit the anti-vibration performance in addition to the shield performance.

The aforementioned explanation is one example, and is not limited or restricted to the correlation between the description of the above embodiment and the scope of claim. For example, in the aforementioned embodiment, the power converter to be mounted on the vehicle, for example, PHEV or EV has been described as the example. The present invention is applicable to the power converter to be applied to the vehicle as construction machine without being limited to the one as described above.

In this embodiment, the power converter having the inverter and the converter integrated has been explained as the example. It is also possible to be configured to only employ the converter.

LIST OF REFERENCE SIGNS

100: converter device
101: case

101a: shield wall, 101b: case, 101c: ground terminal
13: inlet pipe, 14: outlet pipe
200: inverter device, 201: inverter case
102: case cover
104: main transformer, 104a, b: terminal of main transformer
105: inductor element
106: high voltage circuit, 107: low voltage circuit,
108: control circuit board
109: base board, 109a: connection section
120: filter substrate, 120a: capacitor, 120b: filter output bus bar
120c: GND bus bar, 120d: substrate, 120e: holding member
160, 161, 162, 163, 164, 190, 191: bus bar on low voltage substrate
140: ferrite core
122: output terminal, 122a: metallic section of output terminal
122b: mold for output terminal
110: metallic board
H1 to H4: switching element

The invention claimed is:

1. A DC-DC converter comprising:
a transformer;
a high voltage-side switching circuit section electrically disposed between the transformer and a high voltage-side circuit section;
a low voltage-side switching circuit section electrically disposed between the transformer and a low voltage-side circuit section;
a noise filter circuit section electrically disposed between the low voltage-side switching circuit section and the low voltage-side circuit section;
a metallic case that houses the transformer, the high voltage-side switching circuit section, the low voltage-side switching circuit section, and the noise filter circuit section;
a drive circuit board having a drive circuit that drives the low voltage-side switching circuit section; and
a metallic base board having the drive circuit board mounted thereon,
wherein the case has a metallic partition wall disposed in an interior portion of the case and connected to the case;
the partition wall is disposed between, and completely separates from each other, the low voltage-side switching circuit section and the noise filter circuit section; and
the partition wall is connected to the base board.

2. The DC-DC converter according to claim 1,
wherein the base board is disposed at a position opposite a bottom surface of the case, which interpose the low voltage-side switching circuit section.

3. The DC-DC converter according to claim 1,
wherein the low voltage-side switching circuit section includes a first bus bar;
the transformer includes a second bus bar, and the low voltage-side switching circuit section is disposed on a bottom surface of the case;
the transformer is disposed on the bottom surface of the case at a side of the low voltage-side switching circuit section;
the first bus bar is provided erect from the low voltage-side switching circuit section to bend toward a direction in which the transformer is arranged;
the low voltage-side switching circuit section and the transformer are electrically coupled by bonding the first and the second bus bars; and
a bonded section between the first and the second bus bars is formed so that an end side surface of the first bus bar and an end side surface of the second bus bar are laminated while facing the base board.

4. The DC-DC converter according to claim 1,
wherein the case includes a ground terminal for grounding; and
a connection section between the partition wall and the base board is positioned in a space between the noise filter circuit section and the ground terminal.

5. The DC-DC converter according to claim 1, comprising a metallic presser board that presses the transformer toward the bottom surface of the case,
wherein the presser board is disposed in a space between the base board and the transformer.

* * * * *